United States Patent
Scholten

(10) Patent No.: US 9,908,556 B2
(45) Date of Patent: Mar. 6, 2018

(54) RECEPTACLE FOR A CONTROL CIRCUIT THAT CONTROLS AN ELECTRIC MOTOR FOR POWER ASSISTANCE IN A VEHICLE STEERING SYSTEM

(71) Applicant: THYSSENKRUPP PRESTA AG, Eschen (LI)

(72) Inventor: Michael Scholten, Blons (AT)

(73) Assignee: THYSSENKRUPP PRESTA AG, Eschen (LI)

( * ) Notice: Subject to any disclaimer, the term of this patent is extended or adjusted under 35 U.S.C. 154(b) by 66 days.

(21) Appl. No.: 14/888,036

(22) PCT Filed: Apr. 29, 2014

(86) PCT No.: PCT/EP2014/058696
§ 371 (c)(1),
(2) Date: Oct. 29, 2015

(87) PCT Pub. No.: WO2014/177549
PCT Pub. Date: Nov. 6, 2014

(65) Prior Publication Data
US 2016/0101807 A1    Apr. 14, 2016

(30) Foreign Application Priority Data

Apr. 29, 2013   (DE) .................. 10 2013 104 358

(51) Int. Cl.
*H05K 5/02* (2006.01)
*H05K 7/20* (2006.01)
(Continued)

(52) U.S. Cl.
CPC ......... *B62D 5/0406* (2013.01); *H05K 5/0208* (2013.01); *H05K 5/0221* (2013.01); *H05K 5/04* (2013.01); *H05K 7/2039* (2013.01)

(58) Field of Classification Search
CPC .. B62D 5/0406; H05K 5/0208; H05K 5/0221; H05K 5/04; H05K 7/2039
See application file for complete search history.

(56) References Cited

U.S. PATENT DOCUMENTS

| | | |
|---|---|---|
| 2011/0090625 A1 | 4/2011 | Oota |
| 2012/0205184 A1 | 8/2012 | Knoedler et al. |

(Continued)

FOREIGN PATENT DOCUMENTS

| | | |
|---|---|---|
| DE | 102007048075 A1 | 4/2009 |
| DE | 102009029538 A1 | 3/2011 |

(Continued)

OTHER PUBLICATIONS

German language International Search Report for International patent application No. PCT/EP2014/058696; dated Jul. 28, 2014.

(Continued)

*Primary Examiner* — Robert J Hoffberg
*Assistant Examiner* — Hung Dang
(74) *Attorney, Agent, or Firm* — thyssenkrupp North America, Inc.

(57) ABSTRACT

Disclosed is a receptacle for a control circuit that controls an electric motor for power assistance in a vehicle steering system. The receptacle includes a housing for holding the control circuit, wherein the housing has an opening to allow insertion of the control circuit into the housing, and a baseplate for dust-tight closure of the opening of the housing in an end position, wherein the baseplate and the housing can be connected to one another in a dust-tight fashion in a delivery position which is different from the end position.

20 Claims, 3 Drawing Sheets

(51) Int. Cl.
*B62D 5/04* (2006.01)
*H05K 5/04* (2006.01)

(56) References Cited

U.S. PATENT DOCUMENTS

2012/0229005 A1    9/2012  Tominaga
2013/0257232 A1*  10/2013  Tomizawa ............. H02K 29/08
                                                    310/68 R

FOREIGN PATENT DOCUMENTS

| DE | 102010038148 A  | 4/2011  |
| DE | 102010037226 A1 | 3/2012  |
| EP |   2371673 A2    | 10/2011 |

OTHER PUBLICATIONS

English translation of International Search Report for International patent application No. PCT/EP2014/058696; dated Jul. 28, 2014.
English translation of abstract of DE 102010037226 A1.
English translation of abstract of DE 102007048075 A1.
English abstract for DE102010038148.

\* cited by examiner

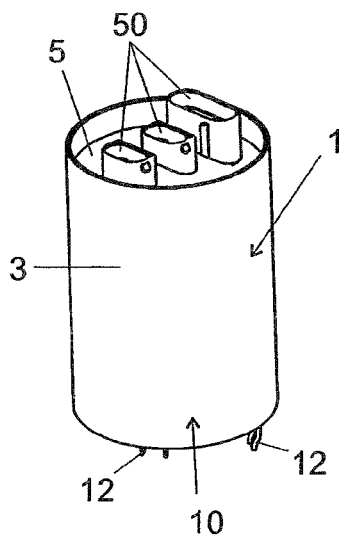
Fig. 7
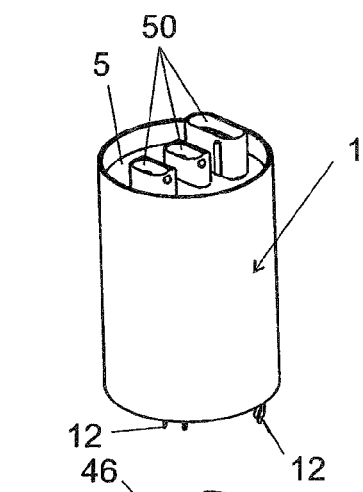
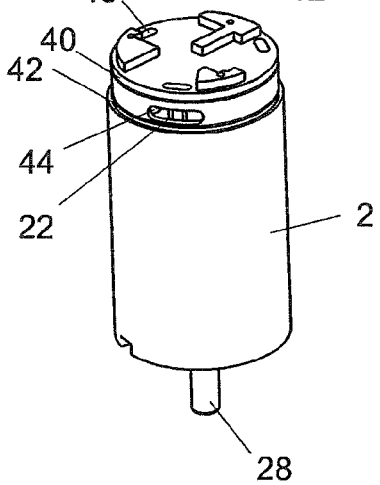
Fig. 9
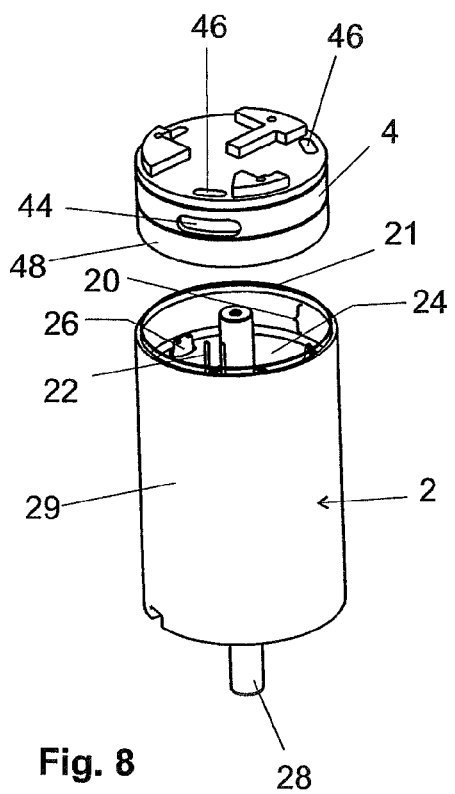
Fig. 8
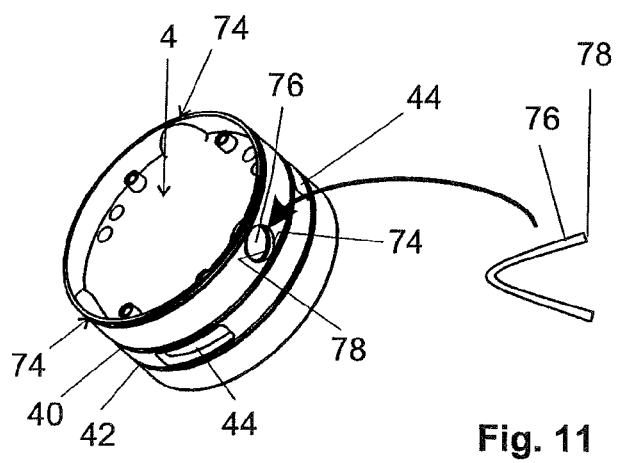
Fig. 10
Fig. 11

RECEPTACLE FOR A CONTROL CIRCUIT THAT CONTROLS AN ELECTRIC MOTOR FOR POWER ASSISTANCE IN A VEHICLE STEERING SYSTEM

CROSS REFERENCE TO RELATED APPLICATIONS

This application is a U.S. National Stage Entry of International Patent Application Ser. No. PCT/EP2014/058696, filed Apr. 29, 2014, which claims priority to German patent application no. DE 102013104358.5 filed Apr. 29, 2013, the entire contents of both of which are incorporated herein by reference.

FIELD

The present invention relates to a receptacle for a control circuit that controls an electric motor for power assistance in a vehicle steering system, preferably for holding a control circuit of an electric motor for providing power assistance for a motor vehicle steering system.

BACKGROUND

In the field of power assistance for vehicle steering systems, for example in the field of power-assisted steering systems, it is known to provide an electric motor by means of which the torque for providing power assistance is applied to the corresponding vehicle steering system, or the corresponding steering gear. A power assistance system is usually composed here of a control circuit (ECU) and an electric motor which is controlled by this ECU. The power assistance system can make available here an assistance force, that is to say an assistance torque, which is intended to reduce the activation forces applied by a driver via a steering wheel. A power assistance system can, however, also make available an additional steering angle, for example in the case of a superimposition steering system in which the steering angle applied by the driver is changed by an additional transmission means. By means of such a power assistance system, it is, for example, also possible to input additional steering movements, for example in the case of automatic lane keeping of the vehicle or for automatic parking.

The electric motor is usually controlled here by means of a control circuit, wherein the control circuit comprises a motor controller and power switches for controlling the power flows for the electric motor are provided. For example MOSFETs may be provided by means of which the power current which is fed to the electric motor is controlled.

The known control circuits which, in addition to the one or more power switches, also comprise control electronics, are usually connected to the electric motors which apply the torque and are protected against environmental influences by means of a housing.

In the case of electric power assistance systems it is desired to form a compact assembly of the electric motor, electronic control circuit and possibly a transmission by means of which the torque produced by the electric motor is applied to the steering system. In this context, good dissipation of heat from the power switching elements which control the energization of the electric motor is to be preferably ensured. Furthermore, a good seal must be provided against environmental influences, such as dust, dirt and moisture, over the entire service life of the power assistance system.

Such an arrangement is known, for example, from DE 10 2007 048 075 A1, in which the control circuit is protected against environmental influences by means of a housing cover which is connected by flanges to the electric motor.

DE 10 2009 029 538 A1 discloses a steering device, in particular an electric power steering device for a motor vehicle, in which an electric control unit is attached to the housing of the electric motor by means of flanges.

Since the electronics and the power components are very sensitive to dust, swarf or other soiling, the corresponding electronics components must be mounted on the electric motor in a clean room, and any ingress of dust, dirt and swarf into the housing of the electronic control circuit has to be prevented. Dirt, dust or swarf can specifically lead to short circuits which would ultimately constitute a safety risk as a result of the power steering assistance.

SUMMARY

One object of the present disclosure is to make available a receptacle for a control circuit by means of which simple and safe mounting of a power assistance system can be achieved.

A receptacle of the present disclosure for a control circuit that controls an electric motor for power assistance in a vehicle steering system, comprises a housing for holding the control circuit, wherein the housing has an opening to allow insertion of the control circuit into the housing, and a baseplate for dust-tight closure of the opening of the housing in an end position. According to the invention, the baseplate and the housing can beconnected to one another in a dust-tight fashion in a delivery position which is different from the end position.

By virtue of the fact that the baseplate and the housing can be connected to one another in a dust-tight fashion in a delivery position which is different from the end position, it is possible to ensure that dust-tight sealing of the control circuit which is accommodated in the housing is already achieved in the delivery position. The control circuit is therefore correspondingly already completely protected against damaging external influences, such as, for example, dust, swarf or dirt, in the delivery position and can then be used to connect to the corresponding electric motor of the power assistance system without renewed opening of the housing. The electric motor is advantageously enclosed in a housing which comprises at least a motor housing baseplate, a motor housing cover and a motor housing jacket, as a result of which a motor assembly is formed. Bearings for the motor shaft are preferably provided in the motor housing cover and/or in the motor housing baseplate, with the result that the motor housing cover and/or the motor housing baseplate can also be embodied as a bearing plate.

Simple pre-mounting of the receptacle together with the control circuit can therefore be performed, for example, in a clean room and the receptacle can then be supplied with the completely mounted control circuit in the delivery position. During the subsequent assembly with the electric motor or the preferred motor assembly of the power assistance system, there is correspondingly no longer any need for the receptacle or the housing to be opened but instead the receptacle with the completely mounted control circuit can then be connected directly to the electric motor or the motor assembly. The control circuit is therefore accommodated in the receptacle free of dust, with the result that safe transport and a safe marriage can be performed between the electric motor or motor assembly and control circuit which does not have to be carried out in a clean room. When the electric motor is arranged in the motor assembly it is also possible to provide a closed seal here, with the result that the electric motor is also securely protected against dust working its way in during transportation to the assembly works. Connecting wires for making electric contact with the motor windings are advantageously led out of the motor assembly, in order to be connected during assembly to a circuit, in particular the control circuit which is arranged in the receptacle.

Particularly preferably, at least one mounting opening is provided in the baseplate, through which mounting opening a contact, guided through the baseplate, of the control circuit is freely accessible in the delivery position. Contact can then be formed with the electric motor, for example in order to make contact with a winding of the electric motor in such a way that conductive connections are formed between MOSFETs, accommodated in the receptacle, of the control circuit with the corresponding winding of the electric motor, being reached through the mounting opening. The contact which is guided through the baseplate is preferably freely accessible here in the delivery state, with the result that the contact between the control circuit and the electric motor can be established. Here, permanent connection between the contacts is preferably established by means of welding, soldering, crimping or some other type of bonding using a tool which is guided through the mounting opening. In particular, the mounting opening in the baseplate permits very good connectability of the receptacle to the motor assembly, since no assembly processes are necessary within the motor assembly. For this purpose, the motor assembly and the receptacle are preferably connected to one another by connecting the baseplate to the motor housing cover and/or the motor housing jacket, and the electrical contacts are then subsequently connected, as described above.

In the end position, the mounting opening and therefore the access to the contacts is then preferably accommodated in the housing of the receptacle, with the result that the assembly is embodied as a whole in a dust-tight fashion. In other words, the mounting opening is closed in the end position.

This readily permits the control circuit which is already accommodated in a dust-tight fashion in the receptacle to be connected in a conductive fashion to the electric motor or the motor assembly, since the corresponding contacts are freely accessible in the delivery state. In the end position, completely dust-tight closure of the entire assembly composed of the receptacle and the electric motor or motor assembly is then achieved. The individual steps of the assembly of the control circuit and the electric motor of the power assistance system are therefore reliably and easily possible, wherein during the assembly process the control circuit is always accommodated protected against dust in the housing, and the contacts for making contact with the electric motor by means of the control circuit are subsequently also accommodated in the housing, in particular during the construction of a motor assembly.

In order to make available the delivery position and the end position, a first latching device for securing the delivery position and a second latching device for securing the end position of the housing with respect to the baseplate are provided. The corresponding latching devices are preferably made available by means of mechanical latching projections or latching cutouts, which correspond to one another and are provided in the housing and on the baseplate.

Particularly preferably, a tamper-proof connection is provided at least in the delivery position, in such a way that renewed opening of the receptacle from the delivery position can be detected. As a result it is possible to ensure that during assembly of the receptacle it is detected whether the control circuit is in the original state in which it is installed in the housing in a dust-tight fashion and free of dust, or whether this state has been possibly compromised. Correspondingly, in this way it is possible to achieve quality assurance for the entire assembly.

Such a tamper-proof connection can be brought about, for example, in that such a latching arrangement in a connection of the housing to the baseplate in the delivery position comprises a barb which, when the housing is opened again, causes a sealing ring to shear off or other attachment elements to break off. Such a barb can also be formed by a separate hook part which is let into a depression and is constructed, for example, as a simple bent piece of sheet metal. This separate hook part preferably interacts with an inwardly directed projection in the housing of the receptacle. It is therefore possible to ensure that the control circuits which are connected to an electric motor of a power assistance system are accommodated in intact receptacles.

A first seal for sealing the housing with respect to the baseplate in the delivery position, and a second seal for sealing the housing with respect to the baseplate in the end position, are preferably provided, wherein a mounting opening, through which a contact, guided through the baseplate, of the control circuit is freely accessible in the delivery position, is preferably provided between the first seal and the second seal.

In order to achieve good dissipation of heat of the power switching elements of the control circuit, a heat-conducting carrier element is preferably provided for the control circuit, preferably for power switches of the control circuit which are connected in a thermally conductive fashion to the baseplate and/or to an end plate.

One particularly preferred refinement of the housing provides a cylindrical embodiment of the housing. With a likewise cylindrical embodiment of the electric motor or of the motor housing jacket of the motor assembly, it is therefore possible to construct a continuous cylindrical shape of the assembly composed of the electric motor or motor assembly and the receptacle for the control circuit.

The housing can be constructed from plastic, preferably with let-in wire mesh for electromagnetic shielding, or constructed from metal. The baseplate is preferably constructed from metal in order to permit, on the one hand, dissipation of the heat and, on the other hand, to permit shielding of magnetic fields from the electric motor. The baseplate is advantageously formed from aluminum.

As a result of the cylindrical refinement, it is also possible to use a simple cylindrical tube as the housing.

A sensor for detecting a property of the electric motor, in particular a rotor position sensor for the drive shaft of the electric motor, is preferably provided on the baseplate. It is therefore possible to achieve a compact design of the sensor too here with a dust-tight seal.

A permanent connection between the receptacle and the electric motor can be achieved by virtue of the fact that the baseplate has a connection region for permanently connecting the baseplate to the electric motor or the motor assembly, preferably by bonding, soldering, welding, screwing or pressing. In particular, the baseplate can be connected to the motor housing cover by pressing in, bonding or in some other way. The connection can particularly advantageously be made via the motor housing jacket which is connected to the motor housing cover. Given a corresponding refinement of the electrical contacts, the bonding thereof can also form a means of securing the connection between the baseplate and the motor housing cover.

In one development, in order to permanently connect on the baseplate a connecting element can also be provided which can be permanently connected to a corresponding connecting element of the electric motor, preferably through a mounting opening.

The abovementioned object is also achieved by means of a method disclosed herein.

An embodiment of a method for connecting a receptacle as disclosed herein with a motor assembly having an electric motor comprises: comprising the steps:
  connecting the baseplate of the receptacle in the delivery position to the motor assembly, preferably by introducing a connection region of the baseplate into a sleeve section of the motor assembly,
  connecting contacts, guided through the baseplate, of the control device to corresponding contacts of the electric motor, preferably through a mounting opening accommodated in the baseplate, and
  closing the receptacle by moving the housing relative to the baseplate from the delivery position into the end position, preferably by linearly fitting a cylindrical housing onto the baseplate, from the delivery position into the end position.

BRIEF DESCRIPTION OF THE DRAWINGS

Preferred further embodiments and aspects of the present invention are explained in more detail by means of the following description of the figures, of which:

FIG. 7 shows a schematic perspective illustration of a receptacle with a control circuit accommodated therein without a baseplate;

FIG. 8 shows a schematic perspective illustration of a motor assembly for power assistance in a vehicle steering system and a baseplate for the receptacle in FIG. 7;

FIG. 9 shows a schematic perspective illustration of the receptacle and of the baseplate of the receptacle in FIG. 7 in conjunction with the motor assembly in FIG. 8 for illustrating the arrangement of the components; and FIG. 10 shows a schematic perspective illustration of an embodiment of the baseplate; and FIG. 11 shows a schematic illustration of a separate hook part as a securing part for forming a secure connection.

DETAILED DESCRIPTION

In the text which follows, preferred exemplary embodiments are described with reference to the figures. Here, identical, similar or identically acting elements in the different figures are denoted by identical reference signs, and a repeated description of these elements is to a certain extent dispensed with in the following description in order to avoid redundancies.

Figure 3:
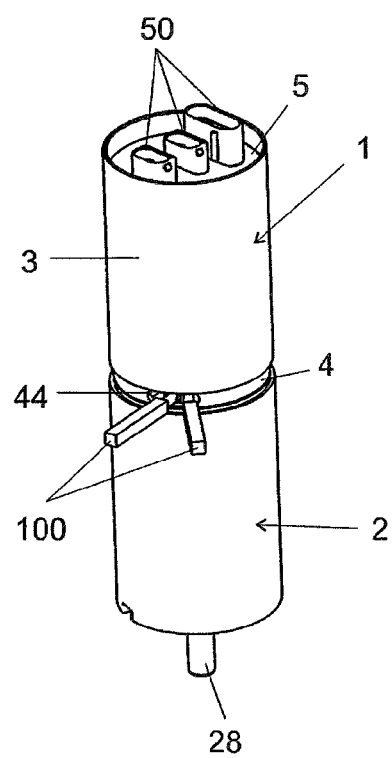
FIG. 3 shows a schematic perspective view of the receptacle from FIGS. 1 and 2 in the delivery position with the permanent connection of contacts of the control circuit, accommodated in the receptacle, to contacts of the electric motor (not illustrated) which is accommodated in the motor assembly.
Figure 4:
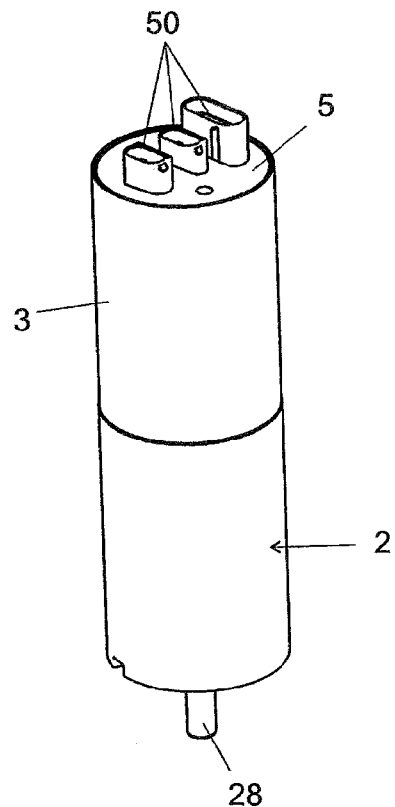
FIG. 4 shows a schematic perspective view of the receptacle and of the motor assembly for FIGS. 1 to 3, wherein the receptacle is in the end position.
Figure 5:
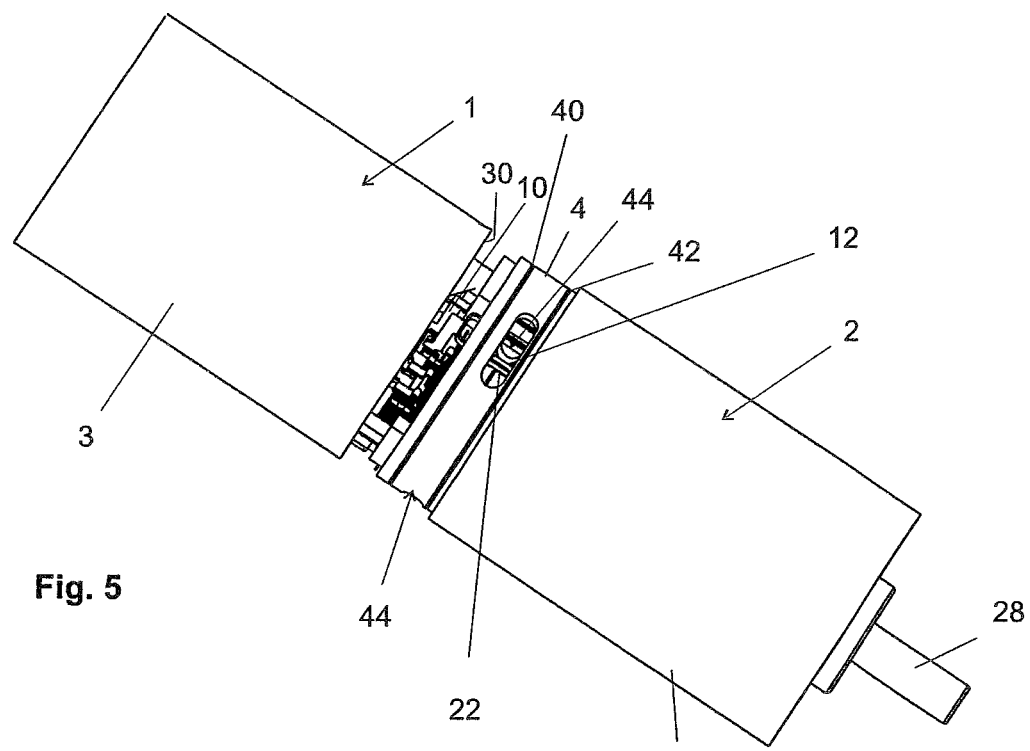
FIG. 5 shows a schematic side view of a receptacle with a control circuit accommodated therein, for controlling an electric motor (not shown) which is arranged in a motor assembly which is shown for applying an auxiliary force to a vehicle steering system.

FIGS. 1 to 5 show a first exemplary embodiment. FIG. 5 shows a schematic side view of a receptacle 1 which is provided for holding a schematically indicated control circuit 10. The receptacle 1 is illustrated in combination with an electric motor, here as a motor assembly 2, for power assistance in a vehicle steering system. The assembly, comprising the receptacle 1 with the control circuit 10 accommodated therein and the motor assembly 2 serves to apply, via the drive shaft 28 of the electric motor, an auxiliary force or an auxiliary torque to a vehicle steering system (not shown here). A transmission of the power assistance system can also be connected between the drive shaft 28 and the actual vehicle steering system in order to adapt the rotational speed and torque of the electric motor to the values required by the vehicle steering system.

The control circuit 10 for actuating the electric motor typically comprises a motor controller which correspondingly has power switches. For example, a MOSFET, by means of which the power current which is fed to the electric motor is controlled, can be provided for each motor phase. The required electric power and control signals for actuating the motor controller are fed to the control circuit 10 via plug-type connections 50 which are located in an end plate 5 of the receptacle 1.

The assembly composed of the receptacle 1 with the control circuit 10 accommodated therein and the motor assembly 2 can serve, in conjunction with a vehicle steering system, to apply an auxiliary force or an auxiliary torque which reduces the steering force which is applied by a driver via the steering wheel. The driver is correspondingly assisted during the steering movement. Additionally or alternatively, in the case of a superimposition steering system a further steering angle can also be applied, for example in order to carry out automatic or assisted lane keeping or in the case of automatic parking of the vehicle, or for changing the steering transmission ratio.

The receptacle 1 has a housing 3 which, as is also apparent, for example, from FIGS. 1 to 4, is embodied essentially as a cylindrical sleeve. This cylindrical sleeve can be cut to length, for example, from a tube which has a corresponding diameter, with the result that the housing 3 is simple to manufacture. The housing 3 is preferably constructed from a plastic material into which, for the sake of shielding against electromagnetic radiation, a wire mesh is preferably inserted. However, the housing 3 can also be constructed completely from metal. The control circuit 10 for controlling the electric motor which is arranged in the motor assembly 2 is introduced into the housing 3 via an opening 30 in the housing 3, and is therefore accommodated in the housing 3.

A baseplate 4 is provided which can close off the opening 30 in the housing 3 in a dust-tight fashion. This dust-tight closure of the opening 30 in the housing 3 takes place in an end position, that is to say a definitive relative position of the housing 3 with respect to the baseplate 4. This end position is shown, for example, in FIG. 4 in which the baseplate 4 is accommodated in the housing 3. In the end position, the assembly which is shown, composed of the receptacle 1 with the control circuit 10 accommodated therein and the motor assembly 2 with an electric motor (not illustrated individually) accommodated therein is made available in a vehicle, for providing power assistance in the vehicle steering system, and complete sealing of the individual components is provided.

Figure 1:
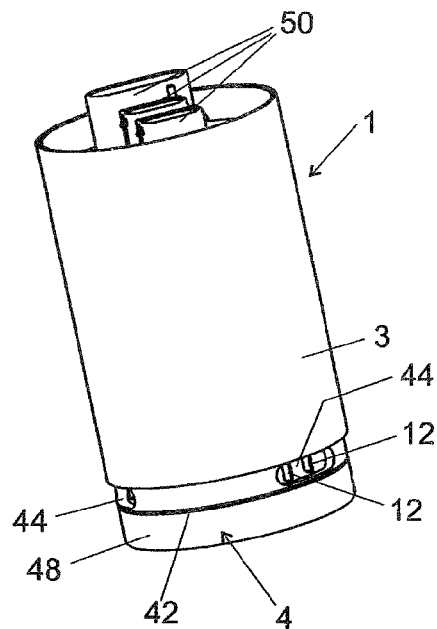
FIG. 1 shows a schematic view of a receptacle with a control circuit (not illustrated) which is accommodated therein in a delivery position, suitable for mounting on an electric motor (not illustrated) for applying an auxiliary force to a vehicle steering system.
Figure 2:
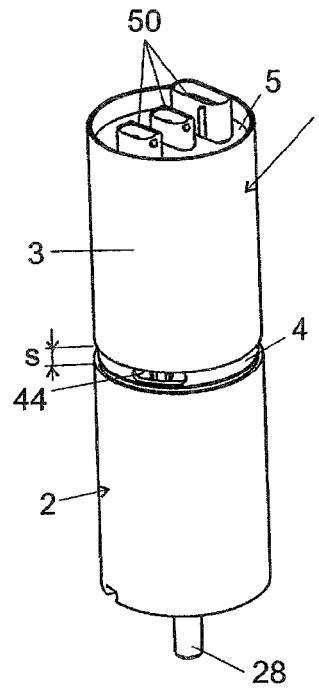
FIG. 2 shows the receptacle from FIG. 1 in a pre-mounted state with a motor assembly in a schematic perspective view, wherein the receptacle is in a delivery position.

However, in order to permit a secure and reliable connection of the receptacle 1 and motor assembly 2, the receptacle 1 also has a delivery position in which the housing 3 is pulled back relative to the baseplate 4, as can be seen in FIGS. 1 and 2. In this delivery position, the receptacle 1 is supplied with the control circuit 10 accommodated therein, as is illustrated in FIG. 1. The receptacle 1 can then be connected to the electric motor or the motor assembly 2, corresponding to FIG. 2. In the delivery position, the housing 3 or the housing opening 30 is also closed off in a dust-tight fashion by the baseplate 4, with the result that during the transportation of the receptacle 1 and during the connection of the receptacle 1 to the electric motor or the motor assembly 2 no dust, no swarf and no further dirt can penetrate the housing 3, and accordingly there is no risk of contamination of the control circuit 10. The safety and reliability of the assembly can therefore be increased.

As is apparent, for example, from FIG. 1 and FIG. 2, the baseplate 4 has a first seal 40 (cf. FIG. 5 or 6) and a second seal 42. The first seal 40 serves for dust-tight sealing in the delivery position, and the second seal 42 serves for further dust-tight sealing in the end position.

Latching devices which interact with corresponding latching devices, complementary thereto, on the inner wall of the housing 3 and which serve to reliably latch the housing 3 relative to the baseplate 4 in the delivery position and in the end position can also be provided at the positions of the first seal 40 and the second seal 42. For this purpose, for example inwardly directed protections (not shown) in the housing 3 can be formed with depressions (not shown) on the circumference of the baseplate 4.

From FIGS. 2 and 3 it is apparent that in the delivery position the housing 3 is not completely fitted onto the baseplate 4 but instead a gap s remains which corresponds approximately to the distance between the seals 40, 42 in the axial direction of the cylindrical housing 3. In order to move the housing 3 into the end position, as it is shown, for example in FIG. 4, the housing 3 is correspondingly slid relative to the baseplate 4 toward the motor assembly 2 by the distance corresponding to the gap s, with the result that the gap s is closed by the housing 3. The baseplate 4 is then completely accommodated in the housing 3 of the receptacle 1 and also in a sleeve section 20, which is formed by a motor housing jacket 29 of the motor assembly 2. From FIG. 4 it is apparent that in the exemplary embodiment shown, the assembly composed of the receptacle 1 in which the control circuit 10 is accommodated, and the motor assembly 2, correspondingly form toward the outside a cylindrical shape at one end of which the drive shaft 28 of the electric motor emerges and at the other end of which the plug-type connections 50 emerge.

The control circuit 10 comprises contacts 12 for making contact with the electric motor, by means of which contacts the power currents are to be passed onto the corresponding windings of the electric motor. In addition to these contacts 12, further contacts 12 can also be provided which serve, for example, to transmit sensor signals from the electric motor or to the electric motor. These contacts 12 of the control circuit are guided through the baseplate 4, with the result that they emerge again on the underside of the baseplate 4. The feedthroughs are preferably sealed in a dust-tight fashion.

The contacts 12 of the control circuit 10 emerge from the baseplate 4 in such a way that they come to be connected to the corresponding contacts 22 of the electric motor 2, bear against the latter or are situated directly opposite them. Provided in the baseplate 4 is at least one mounting opening 44 through which it is possible to access the contacts 12, 22 which bear one against the other. The contacts 12, 22 are correspondingly accessible via the mounting opening 44 even if the receptacle 1 is in the delivery position and the baseplate 4 is already connected to the electric motor or the motor assembly 2. The mounting opening 44 is therefore preferably inserted laterally into the baseplate 4, with the result that the contacts 12, 22 can be accessed radially through the mounting opening 44.

FIG. 3 shows a state in which the contacts 12, 22 can be accessed through the mounting openings 44 by means of a welding tool 100, in order to connect these contacts permanently to one another. Such a permanent connection of the contacts 12, 22 can be achieved, for example, by soldering, welding, crimping or other bonding methods. Since the access to the contacts 12, 22 is made possible in the delivery state of the receptacle 1, the control circuit 10 is accommodated in the receptacle 1, protected in a completely dust-tight fashion. Any soiling which occurs through the process of the permanent connection of the contacts 12, 22 therefore cannot adversely affect the control circuit 10.

In the region of the first seal 40 and of the second seal 42, a first detent is preferably provided for the delivery position and a second detent for the end position. Correspondingly, the cylindrical housing 3 can be fitted onto the baseplate 4 until the delivery position is reached by latching with the first detent. In this state, the receptacle 1, which then surrounds the control circuit 10, is formed in a state in which the control circuit 10 is sealed in a dust-tight fashion with respect to the surroundings and is present in the interior of the cylindrical housing 3.

Although FIG. 5 shows an illustration in which the control device 10 can still be seen, and the delivery position has correspondingly not yet been reached, this is merely to be understood as an exemplary illustration. The control circuit 10 is usually mounted in the housing 3 with the baseplate 4 in a separate clean room or a separate mounting unit in such a way that ingress of dust, dirt or swarf into the interior of the housing 3 is effectively prevented. The receptacle 1 in which the control circuit 10 is accommodated is then delivered in the state shown in FIG. 1, corresponding to the mounting with the electric motor 2, that is to say with the housing 3 and the baseplate 4 in the delivery position in which complete sealing of the interior is correspondingly achieved. During this subsequent mounting of the electric motor or of the motor assembly 2 on the receptacle 1, no further dust, dirt or swarf can correspondingly penetrate the interior of the housing 3, with the result that the control circuit 10 is held completely free of dust in the receptacle 1.

In particular, the connection of the control circuit 10 to the electric motor or to the motor assembly 2 and in particular the connection of the contacts 12 of the control circuit 10 to the contacts 22 of the electric motor by corresponding bonding techniques such as soldering, welding or crimping prevents any foreign bodies from being carried into the housing 3, since the housing is already closed off in a dust-tight fashion. In this way it is possible to ensure that during the mounting or the marriage of the electric motor or motor assembly 2 and the receptacle 1 in which the control circuit 10 is accommodated the control circuit 10 is not compromised.

After the step shown in FIG. 3 of permanently connecting the contacts 12, 22 to one another, for example by the welding shown by means of the welding tool 100, the housing 3 is then moved, as shown in FIG. 4, into the end position, with the result that the mounting opening 44 is also sealed.

The mounting opening 44 is, as is apparent, for example, from FIGS. 1 and 8, located between the seals 40, 42, with the result that as a result of complete fitting of the cylindrical housing 3 onto the baseplate 4 the housing 3 comes into contact with both seals 40, 42 and therefore the mounting opening 44 is also accommodated in a dust-tight fashion in the housing 3.

A tamper-proof connection is preferably provided at least in the delivery position, shown in FIGS. 1, 2 and 3, of the receptacle 1. The tamper-proof connection can be formed, for example, in that in the case of renewed opening of the housing 3 with respect to the baseplate 4, starting from the delivery position, for example a first seal 40 is penetrated by means of a barb. Therefore, in a following mounting step it is immediately apparent whether the receptacle 1 which is to be connected to a motor assembly 2 is one which is in the original delivery state, which makes it therefore possible to assume that the control circuit 10 is located in a dust-free space within the housing 3, or whether such essentially dust-free accommodation of the control device 10 cannot be ensured, since the receptacle 1 has been opened incorrectly. For this purpose, in one embodiment of the receptacle 1 according to FIGS. 10 and 11, one or more depressions 74 can be provided in the baseplate 4, into each of which depressions 74 a hook element 76 is introduced, the hook 78 of which respectively interacts with a projection (not illustrated) in the housing, which hook 78 is directed inward. The arrow between the FIGS. 10 and 11 illustrates how the hook element 76 is inserted into the depression 74. The hook element 76 can be embodied as a simple round, folded sheet-metal part, as is illustrated in a side view in FIG. 11. The hook 78 is then formed by an end region, and in the inserted position it should be oriented in the direction of the sliding of the housing 3 during mounting, in order to form a barb when there is an attempt at opening by pulling off the housing 3.

FIGS. 7 to 9 show the receptacle 1 in further illustrations, wherein in FIG. 5 only the housing 3 with the contacts 12 protruding downward out of the housing 3 is shown. An end plate 5, on which plug-type connections 50 are provided, by means of which plug-type connections 50 contact can be made with the control circuit 10 and correspondingly a connection to a superordinate motor vehicle controller and a power supply can be brought about, is also provided.

The housing 3 of the receptacle 1 is preferably manufactured from a plastic material. A wire mesh is preferably integrated into the plastic material in order to keep electromagnetic interference away from the control circuit 10. In a further preferred variant, the housing 3 is constructed from metal, preferably from aluminum.

The housing 3 is preferably formed in a completely cylindrical fashion, with the result that the housing 3 can easily be fitted onto the baseplate 4, and correspondingly sliding from the delivery position into the end position is made possible.

In FIG. 8, the baseplate 4 is shown individually above the motor assembly 2, with the result that it is apparent how the baseplate 4 can be connected to the motor assembly 2. The baseplate 4 can be fitted, in a connection region 48, into the sleeve section 20 of the motor housing jacket 29 of the motor assembly 2, in order to form a connection between the receptacle 1 and the electric motor or motor assembly 2. For the purpose of connection, the connection region 48 can either be pressed into the sleeve section 20 of the motor assembly 2 or bonded, soldered, welded or screwed thereto. In order to bring about an at least dust-tight connection here also, a seal 21 can be provided in the sleeve section 20 of the motor assembly 2, which seal 21 makes available a seal between the baseplate 4 and the electric motor 2. The electric motor has contacts 22 for making contact with windings of the electric motor, for example a stator winding or a rotor winding, or with sensors accommodated in the motor. The contacts 22 project from a motor housing cover, embodied as a bearing plate 24, of the motor assembly 2. During the connection to the electric motor or the motor assembly 2, the mounting opening 44 of the baseplate 4 is correspondingly oriented in such a way that the contacts 12, corresponding to the contacts 22 of the electric motor, of the control circuit 10 are correctly oriented. The contacts 12, 22 are then arranged bearing directly one on the other or in the vicinity such that they can be connected to one another through the mounting opening 44 in the baseplate 4 by means of corresponding tools.

When the baseplate 4 is installed in the housing 3, the contacts 12 of the control circuit 10 are fed through corresponding contact feedthroughs 46 in the baseplate 4, preferably in a clean room, and these contact feedthroughs 46 are sealed with the contacts 12 accommodated therein. The contact feedthroughs 46 are oriented so as to correspond to the mounting openings 44, with the result that access to the contacts 12 of the control circuit 10 and of the contacts 22 of the electric motor 2 can be made through the mounting opening 44.

The bearing plate 24 of the electric motor of the motor assembly 2 which serves to mount the drive shaft 28 is also provided with contact feedthroughs 26 through which the contacts 22 of the electric motor can be guided. The corresponding contact feedthroughs 26 are also sealed.

The bearing plate 24 is also particularly preferably embodied as a shield for the magnetic fields occurring in the electric motor ("B shield"), with the result that excessive inputting of the magnetic field from the electric motor or the motor assembly 2 into the control circuit 10 can be prevented. The baseplate 4 can also be embodied with such a shield effect. Further functions are preferably integrated into the bearing plate 24. For example, the windings of the electric motor can be guided and secured to deflecting elements (not shown) of the bearing plate.

FIG. 9 shows how the baseplate 4 is connected to the motor assembly 2. The connection region 48 is correspondingly completely pushed into the sleeve section 20 of the motor housing jacket 29 of the motor assembly 2. This figure serves only for the purpose of illustration and does not represent a preferred method step. In this arrangement the assembly composed of the control circuit and electric motor with its corresponding housings would have to be mounted in a clean room, as is already the case now in the prior art.

Figure 6:
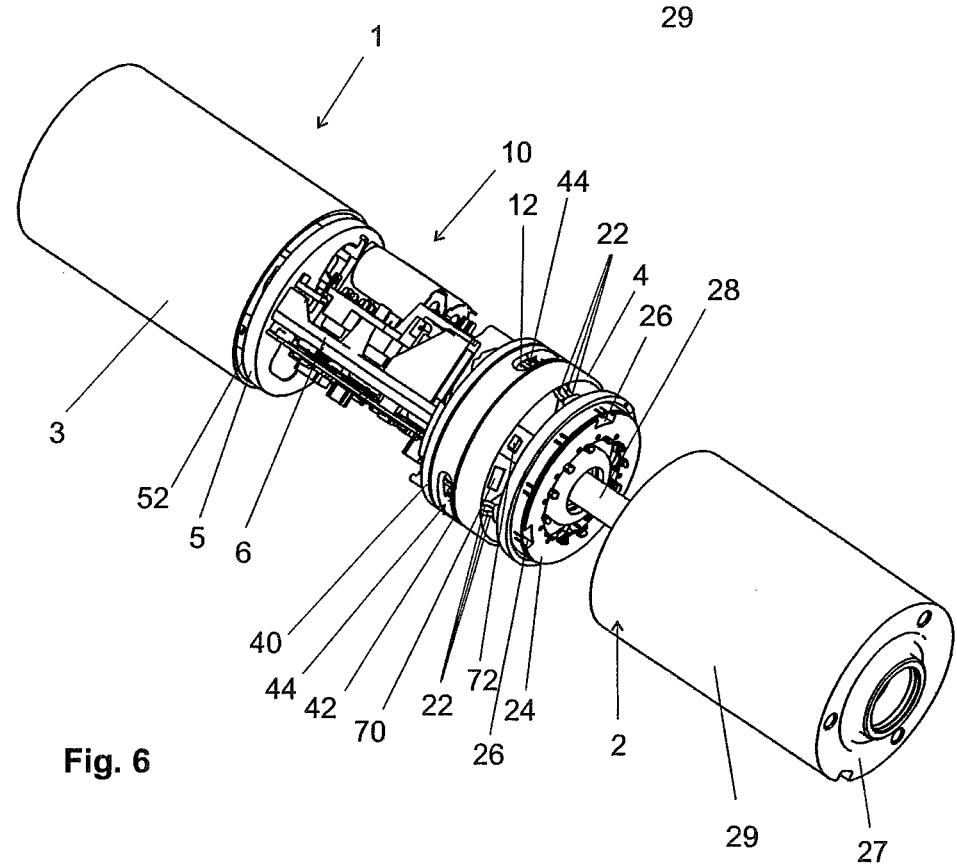
FIG. 6 shows a schematic perspective illustration of a receptacle in combination with an electric motor which is not shown and is arranged in a motor assembly, for power assistance in a vehicle steering system in an exploded, schematic illustration along the cylinder axis of the housing.

FIG. 6 illustrates the assembly composed of the receptacle 1 and the electric motor 2 in an exploded view in which the different elements can be clearly seen.

The housing 3 is shown in a completely pulled-back position in FIG. 6, while here it is pulled beyond the end plate 5. A seal 52 on the circumference of the end plate 5 permits dust-tight sealing of the housing 3 with respect to the end plate 5 in such a way that the volume of the housing 3 can be shielded in a dust-tight fashion with respect to the surroundings. By means of the seal 52, the housing 3 can also be slid with respect to the end plate 5. In other words, the housing 3 which is embodied in a sleeve shape can be slid in the axial direction both with respect to the baseplate 4 and with respect to the end plate 5. This sliding permits the movement of the housing 3 relative to the baseplate 4 from the delivery position into the end position. In this context, the housing 3 is fitted onto the baseplate 4 to such an extent that the housing 3 abuts against the sleeve 20 of the electric motor 2.

A carrier element 6 is provided on which the control circuit 10 is fitted. The carrier element 6 is preferably embodied in a thermally conductive fashion and is preferably connected in a thermally conductive fashion to the end plate 5 and/or the baseplate 4, in order to permit heat generated by the control circuit 10, and, in particular, the power switching elements of the control circuit 10, to be dissipated via the end plate 5 and/or the baseplate 4.

In the illustration shown in FIG. 6, it is possible to see from below into the baseplate 4 and view the contacts 22 of the electric motor 2 which are to be connected to the contacts 12, introduced from above, of the control circuit 10.

A wire of a motor winding can be used directly as a contact 22, with the result that for the formation of contacts becomes more reliable through the avoidance of additional connections. It is possible to dispense with a motor crown. In the case of the electric motor 2, all the connections are preferably arranged on one side, that is to say the side facing the receptacle 1. In this way, the formation of contact between the electric motor and the control circuit 10 in the receptacle 1 is simplified. The positioning and the securing of the wire of the motor winding can be performed here by the bearing plate 24, wherein the corresponding wires have to be secured only in such a way that they can be permanently connected to the contacts 12 of the control circuit 10.

The output shaft 28, such as is shown, for example in FIG. 8, preferably extends beyond the bearing plate 24, with the result that a schematically indicated rotation position sensor 70 (RPS), which is operatively connected to a corresponding encoder 72 connected to the motor shaft 28, can be provided on the underside of the baseplate 4. Correspondingly, data relating to rotation and positioning of the drive shaft 28 of the electric motor 2 can be transmitted to the control circuit 10 by the rotation position sensor. The rotation position sensor 70 can either be connected directly to the control circuit 10 via a contact breakthrough in the baseplate 4 or else it can be coupled inductively to a corresponding sensor located on the inner side, that is to say on the inside of the housing 3, in the end position.

In one development (not shown), in addition to the contacts 12 connecting elements, for example in the form of projecting pins which can be permanently connected to corresponding connecting elements of the electric motor or the motor assembly, are provided on the baseplate 4. The connecting elements of the electric motor or of the motor assembly 2 can, for example, also be present in the form of pins which extend from the bearing plate 24. The connecting elements of the baseplate 4 and of the bearing plate 24 can then preferably be connected through a mounting opening 44 using a corresponding tool, for example by welding. In this way, a secure connection is produced between the baseplate 4 and therefore the receptacle 1 and the motor assembly 2 or the electric motor. The contact-forming elements of the contacts 12, 22 which are connected to one another are mechanically relieved by these further connections.

Insofar as they can be applied, all the individual features which are presented in the individual exemplary embodiments can be combined with one another and/or interchanged without departing from the scope of the invention.

LIST OF REFERENCE SIGNS

1 Receptacle
10 Control circuit
12 Contact
100 Welding tool
2 Electric motor
20 Sleeve section
21 Seal
22 Contact
24 Bearing plate
26 Contact feedthrough
27 Motor housing plate
28 Drive shaft
29 Motor housing jacket
3 Housing
30 Opening
4 Baseplate
40 First seal
42 Second seal
44 Mounting opening
46 Contact feedthrough
48 Connection region
5 End plate
50 Plug-type connection
52 Seal
6 Carrier element
70 Rotation position sensor
72 Encoder
74 Cutout
76 Hook element
78 Hook
s Gap

The invention claimed is:

1. A receptacle for a control circuit that controls an electric motor for power assistance in a vehicle system, comprising:
   a housing configured to hold the control circuit therein and having an opening defined therein for receiving the control circuit; and
   a baseplate removeably coupled to said housing at said opening and moveable with respect to said housing between an end position and a delivery position that is different than said end position, said baseplate being configured to provide a dust tight closure of said opening when positioned in either of said end position or said delivery position, wherein said baseplate comprises at least one mounting opening defined therein through which at least one contact of the control circuit is freely accessible when said baseplate is positioned in the delivery position.

2. The receptacle of claim 1, wherein said mounting opening is covered by said housing when said baseplate is in said end position.

3. The receptacle of claim 1, further comprising a tamper-proof connection formed between said housing and said baseplate when said baseplate is positioned in said delivery position with respect to said housing, such that attempts to move said baseplate from said delivery position back to said end position are detectable.

4. The receptacle of claim 1, further comprising a heat-conducting carrier element coupled in a thermally conductive manner to at least one of said baseplate or an end plate of the receptacle.

5. The receptacle of claim 1, wherein said housing has a cylindrical shape.

6. The receptacle of claim 1, wherein said housing is made of at least one of a wire mesh reinforced plastic or metal.

7. The receptacle of claim 1, wherein said baseplate is made of metal.

8. The receptacle of claim 1, further comprising a sensor disposed in said baseplate and configured to detect a property of the electric motor.

9. The receptacle of claim 8, wherein said sensor is a rotor position sensor for a drive shaft of the electric motor.

10. The receptacle of claim 1, wherein said baseplate further comprises a connection region configured to permanently connect said baseplate to the electric motor.

11. The receptacle of claim 10, wherein said permanent connection is achieved by one of a bonding, soldering, welding, screwing, or press fitting process.

12. The receptacle of claim 1, wherein said baseplate further comprises at least one connecting element configured to be permanently coupled to a corresponding connecting element of the electric motor.

13. A receptacle for a control circuit that controls an electric motor for power assistance in a vehicle system, comprising:
   a housing configured to hold the control circuit therein and having an opening defined therein for receiving the control circuit; and
   a baseplate removeably coupled to said housing at said opening and moveable with respect to said housing between an end position and a delivery position that is different than said end position, said baseplate being configured to provide a dust tight closure of said opening when positioned in either of said end position or said delivery position;
   a first latching device configured to latch said housing to said baseplate when said baseplate is positioned in said delivery position; and
   a second latching device configured to latch said housing to said baseplate when said baseplate is positioned in said end position.

14. The receptacle of claim 13 further comprising a sensor disposed in said baseplate and configured to detect a property of the electric motor.

15. The receptacle of claim 14 wherein the sensor is a rotor position sensor for a drive shaft of the electric motor.

16. The receptacle of claim 13 wherein the baseplate comprises a connection region configured to connect the baseplate to the electric motor.

17. The receptacle of claim 13 further comprising a tamper-proof connection formed between the housing and the baseplate when the baseplate is positioned in the delivery position with respect to the housing.

18. The receptacle of claim 13 wherein the housing is comprised of a wire mesh reinforced plastic.

19. The receptacle of claim 13 wherein the baseplate further comprises at least one connecting element configured to be coupled to a corresponding connecting element of the electric motor.

20. A receptacle for a control circuit that controls an electric motor for power assistance in a vehicle system, comprising:
   a housing configured to hold the control circuit therein and having an opening defined therein for receiving the control circuit; and
   a baseplate removeably coupled to said housing at said opening and moveable with respect to said housing between an end position and a delivery position that is different than said end position, said baseplate being configured to provide a dust tight closure of said opening when positioned in either of said end position or said delivery position;
   a first seal operatively disposed between said housing and said baseplate, and configured to seal said housing to said baseplate when said baseplate is positioned in said delivery position;
   a second seal operatively disposed between said housing and said baseplate, and configured to seal said housing to said baseplate when said baseplate is positioned in said end position; and
   a mounting opening defined between said first seal and said second seal and through which mounting opening a contact of the control circuit is freely accessible when said baseplate is positioned in the delivery position.

* * * * *